United States Patent [19]

Schwarz

[11] Patent Number: 4,739,258
[45] Date of Patent: Apr. 19, 1988

[54] DYNAMIC TESTING OF THIN-FILM CONDUCTOR

[75] Inventor: James A. Schwarz, Fayetteville, N.Y.
[73] Assignee: Syracuse University, Syracuse, N.Y.
[21] Appl. No.: 884,793
[22] Filed: Jul. 11, 1986
[51] Int. Cl.$^4$ ...................... G01R 27/02; G01N 27/14
[52] U.S. Cl. ............................. 324/158 R; 324/65 R; 374/57
[58] Field of Search ............... 324/158 R, 65 R, 73 R; 374/57

[56] References Cited

U.S. PATENT DOCUMENTS

| | | | |
|---|---|---|---|
| 3,548,491 | 12/1970 | Ainslie et al. | 357/65 X |
| 3,710,251 | 1/1973 | Hagge et al. | 324/158 F |
| 4,483,629 | 11/1984 | Schwartz et al. | 324/65 R X |
| 4,567,432 | 1/1986 | Buol et al. | 324/158 F |

FOREIGN PATENT DOCUMENTS 58-14069  1/1983  Japan .............................. 324/158 R

OTHER PUBLICATIONS

J. Phys. Chem. Solids (GB), vol. 37, "Activation Energy for Electratransport in Thin Aluminum Films by Resistance Measurements", Hummel et al., 1976, pp. 73-80.

Primary Examiner—Reinhard J. Eisenzopf
Assistant Examiner—Stephen M. Baker
Attorney, Agent, or Firm—Bruns and Wall

[57] ABSTRACT

The reliability and life cycle of a thin-film conductor is predicted accurately and directly by measuring changes in its resistivity during an interval in which its temperature is dynamically increased. A semiconductor wafer containing a number of integrated circuits, each of which contains the thin-film conductor, is placed on a test platform of a semiconductor test station, where probes are positioned to supply a constant current stress to the conductor and to measure the voltage across it. A ramp current is supplied to a resistive heating element on the test platform to effect a linear rise in temperature over a span of time to the thin-film conductor. Changes in the conductor resistivity with respect to temperature provide kinetic data related to electromigration damage in the conductor, and hence to reliability over time.

14 Claims, 4 Drawing Sheets

DYNAMIC TESTING OF THIN-FILM CONDUCTOR

BACKGROUND OF THE INVENTION

This invention relates generally to the reliability testing of conductors that are subject to mass transport of atoms, and, is more particularly directed to a process for evaluating the reliability of a thin-film interconnector of the type typically employed in micro-electronic devices.

Thin-film conductors of the type typically employed in microcircuits and other integrated circuits deteriorate over time due to a process known as electromigration. Under certain adverse conditions, this process can lead to early circuit failure. Electromigration failure generally involves the movement of atoms in the direction of current flow from a donor region into an acceptor region.

Electromigration failure generally occurs as two separate stages. During a first stage of failure, referred to as the electromigration damage (EMD) stage, atoms move out of the donor region under relatively well defined conditions, leaving behind voids in the material. The transported atoms are deposited in the acceptor region thereby creating hillocks. The second stage of electromigration failure, referred to as the catastrophic failure process (CFP) stage, is characterized by complex temperature and current density variations that lead to rapid and complete failure of the device. These two stages of electromigration failure always occur in sequence, with EMD being first. The damage that occurs in the early stages of the process follow well-defined conditions of temperature, temperature distribution, and current density. These conditions remain relatively constant during EMD, and to a great extent control the failure process over the life cycle of the conductor. The second, more dramatic stage of the failure process, while still electromigration is not characterized by the initial conditions of temperature and current density previously experienced by the conductor, but rather by local current densities and temperatures that develop in the now highly stressed donor region. Although the second stage of failure is a consequence of the first, it nevertheless occurs with rapid kinetics and under less well-defined conditions than those experienced during the earlier stages. EMD occurs over a major portion of the conductor life, while CFP takes place during a relatively brief period at the end of the life cycle. That is, EMD controls the overall failure process, and thus lays the template for the ultimate CFP.

During the past years different techniques have been applied to determine the activation energy. The life time test is the most common measurement method which records the mean time to failure ($t_{50}$) when 50% of identical samples fail due to electromigration. Mean time to failure is measured as a function of test temperature to evaluate activation energy Q and the pre-exponential A.

The resistance method is the most simple technique. A stripe is stressed at constant current and temperature. The increase in the resistance of the stripe with time is recorded. The activation energy and pre-exponential are determined from the temperature dependence of the resistance change per unit time.

Electrical resistance and resistivity measurements taken under isothermal conditions have been employed to study the kinetics of the electromigration process, and a thorough treatment of this type of testing is given by Hummell et al in Journal of Physics and Chemistry of Solids, Pergamum Press, 1976, Vol. 37, pp 73-80, (printed in Great Britain).

Recently a new technique called Temperature-ramp Resistance Analysis to Characterize Electromigration (TRACE) has been developed. Its principal advantage is that the activation energy and pre-exponential can be determined from one experiment requiring a few hours. This method allows operation through a given temperature range in a pre-selected time. In addition, this method allows systematic investigation of low temperature processes normally ignored by constant-temperature experiments. This process is set forth in U.S. Pat. No. 4,483,629.

While the dynamic testing process of the U.S. Pat. No. 4,483,629 has been highly successful in predicting the life cycle of conductors of complex integrated circuitry, that process requires that the IC devices be finished, that is, encapsulated in a shell or package, and that the devices be tested in the controlled atmosphere of a sealed chamber.

Electromigration phenomenom in thin films are currently receiving considerable attention. This is largely due to the implications of electromigration damage (EMD) on the reliability of Very Large Scale Integration (VLSI) devices.

Until now, all the above techniques have been applied to study the kinetics of the electromigration process in packaged samples. While the life time test and the resistance method have been applied at the wafer level, TRACE experiments have not been tried. The objective of the present invention is to apply TRACE at the wafer level. This objective is not trivial. Due to rapid analysis afforded by the TRACE technique, new metallizations and stripe architecture can be screened directly, eliminating the costly and time consuming steps of packaging.

OBJECTS AND SUMMARY OF THE INVENTION

It is therefore an object of this invention to provide an improved method and apparatus for evaluating the reliability of a thin-film conductor and, in particular, of a thin-film interconnector as typically used in a microelectronic integrated circuit device.

It is a further object of this invention to reduce the time required to evaluate the reliability of such a conductor, and to simplify the testing process.

It is yet another object of this invention to improve the accuracy in prediction of the conductor's life span.

It is a further object of this invention to simplify method and apparatus for testing the thin-film conductor so as to determine the values of activation energy (Q) and pre-exponent (A) associated with the electromigration process for a number of integrated circuits on the same semiconductor wafer.

In accordance with an aspect of this invention, a method is provided for determining the kinetic parameters of activation energy and the pre-exponential factor of the electromigration process in a thin-film conductor that is formed as a part of an integrated circuit on a semiconductor wafer. This thin-film conductor is subject to high current densities at elevated temperatures. The method is carried out by placing the semiconductor wafer on a test platform or stage of a test unit. The test unit has a number of probes which can be adjusted precisely to place the probes into contact with predetermined thin-film conductors on the integrated circuit. A resistive heating element is disposed on the test platform in proximity to the semiconductor wafer.

After the wafer has been positioned in the test unit and the probes have been contacted to the integrated circuit, the thin-film conductor is electrically stressed by applying a constant or uniform current to it. At the same time, a ramp current is provided to the resistive heating element so that the stressed thin-film conductor is heated at a rate that increases linearly with respect to time. Changes in the resistance of the current-stressed conductor are measured as the conductor's temperature rises linearly, and the measured changes in resistance are compensated for those changes that are due to the temperature-dependent components of resistance. The resulting changes in resistance represent those due to the electromigration failure process. Then, the activation energy Q and the pre-exponential factor A are calculated by relating the measured changes in resistance over time, as produced by the electromigration failure process to the following zeroth order rate expression:

$$1/R_0 \, dR/dt = A \exp(-Q/kT).$$

In the above expression, $R_0$ is the initial resistance of the thin-film conductor, $dR/dt$ is the variation in time of the conductor resistance, Q is the activation energy for the process, A is the pre-exponential factor for the electromigration process, k is Boltzmann's constant, and T is absolute temperature.

In a preferred apparatus for carrying out this testing, a semiconductor wafer test apparatus is employed that has a test platform with a chuck on which the wafer is mounted, a plurality of probes, each of which can be moved to contact with electrodes on the integrated circuit, and a resistive heating element mounted on the platform in proximity to the semiconductor wafer. The apparatus also includes electrical circuitry coupled to one pair of the probes for supplying the constant current flow through the conductor as the same is being heated. A heating current supply circuit sends a ramp current to the resistive heating element for increasing the temperature of the wafer, and thus also the temperature of the conductor, so that the temperature rises linearly over time. Circuitry that is coupled to another pair of the probes measures the changes in resistance of the thin-film conductor as the temperature of the conductor increases at the linear rate over a predetermined period of time, and a measuring circuit measures the change in temperature of the wafer, so that the change in conductor resistance due to the electromigration failure process can be calculated by relating the changes to the activation energy and pre-exponential factor. A record of the changes in resistance over the predetermined period of time is obtained from these calculations.

The above and many other objects, features, and advantages of this invention will be more fully understood from the ensuing description of a preferred embodiment of this invention, which should be considered in connection with the accompanying drawings.

DETAILED DESCRIPTION OF THE PREFERRED EMBODIMENT

With the current trend in electronics towards very large scale integration (VLSI) of circuits, research into the reliability problems associated with so called submicron devices is required, and in particular to studying the effects of high material transport rates that are produced in high diffusity paths that have short diffusion distances. As aforesaid, one such transport phenomenom is the electromigration of atoms from a donor region to an acceptor region, and this type of failure can dramatically limit the life cycle of the conductor. As is well known in the semiconductor industry, and as is well explained in U.S. Pat. No. 4,483,629, the kinetic parameters of the electromigration failure process are the activation energy Q and pre-exponential factor A.

A discussion of the basic problem of electromigration failure, and of its theory, as well as a discussion of the dynamic testing of semiconductor devices to measure the kinetic parameters of this phenomenom, are all found in the earlier U.S. Pat. No. 4,483,629, and such discussion is incorporated herein by reference. Some of the salient points of that discussion will be repeated here for the sake of convenience.

The kinetics of electromigration have been determined through mean-time to failure (MTF) experiments, and are described according to the relationship $$(MTF) = A'J^n \exp(-Q/kT) = A'' \exp(-Q/kT).$$

Where $A''$ is the pre-exponential factor for the process, J is the current density applied to the conductor, n is an exponent that is generally in the range of 1 to 3; Q is the activation energy for the process; k is Boltzmann's constant, and T is the absolute process temperature. In analogy to the above equation, the following expression represents the conditions for small changes in resistance of the conductor:

$$1/R_o \, dR/dt = A''' J^m \exp(-Q/kT) = A \exp(-Q/kT)$$

Where m is current density exponent determined from resistance change measurements in the range of $1 < m < 3$, $R_o$ is the initial resistance of the conductor at room temperature, and $dR/dt$ is the variation in the conductor resistance under EMD conditions. This equation shows that there is an observed linear time dependence of resistivity changes during the early stages of electromigration.

If allowance is made for linear baseline from the total resistance changes which can be measured over a temperature variance range, the remaining electromigration component of resistivity is related to temperature and time by the zeroth order kinetics process as follows:

$$1/R_o \cdot dR_{em}/dt = A \exp(-Q/kT)$$

Where $R_{em}$ is the electromigration component of resistance change.

As explained in more detail in U.S. Pat. No. 4,483,629, this can be expressed logarithmically as follows:

$$ln[T^{-2}(\Delta R_{em}/R_o)] = -Q/kT + ln(Ak/\beta Q)$$

Where ln is the natural logarithm of the indicated argument, and $\beta$ is the rate of heating.

Measuring the voltage across the conductor, at constant current conditions, during times that the temperature is being increased linearly and in known fashion, a characteristic plot of ln $[T^{-2}(\Delta R_{em}/R_o)]$ versus $1/T$ can be carried out, this plot produces a line having a slope s. The activation energy Q can be determined from the relationship $Q = -ks$ where k is Boltzmann's constant. Likewise, the pre-exponential factor A can be calculated from this slope by employing the relationship $A = -s \exp I$, where $I = ln(Ak/\beta Q)$.

Figure 1:
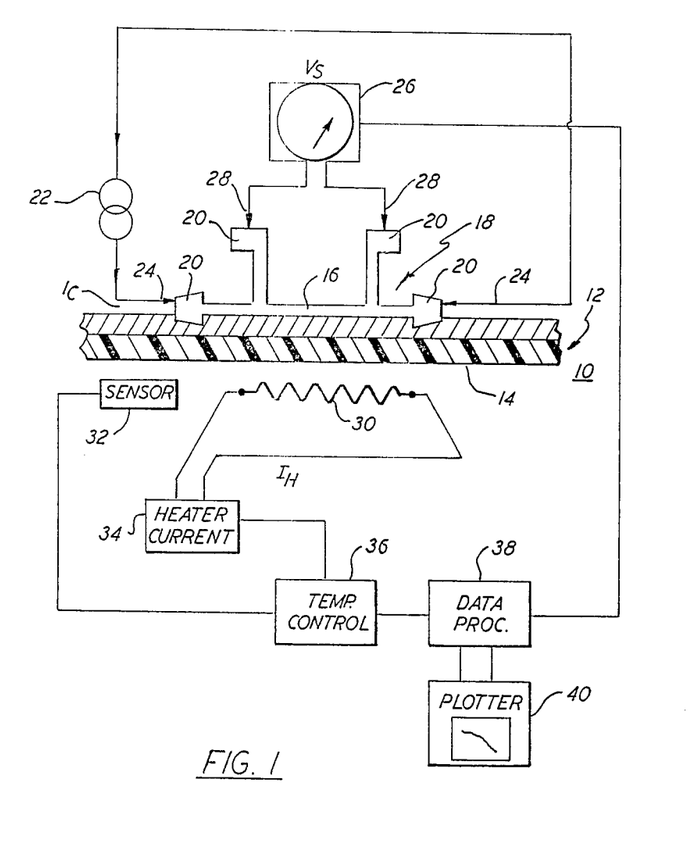
FIG. 1 is a schematic representation of a typical test specimen, together with other elements employed in the apparatus and method of testing.
Figure 2:
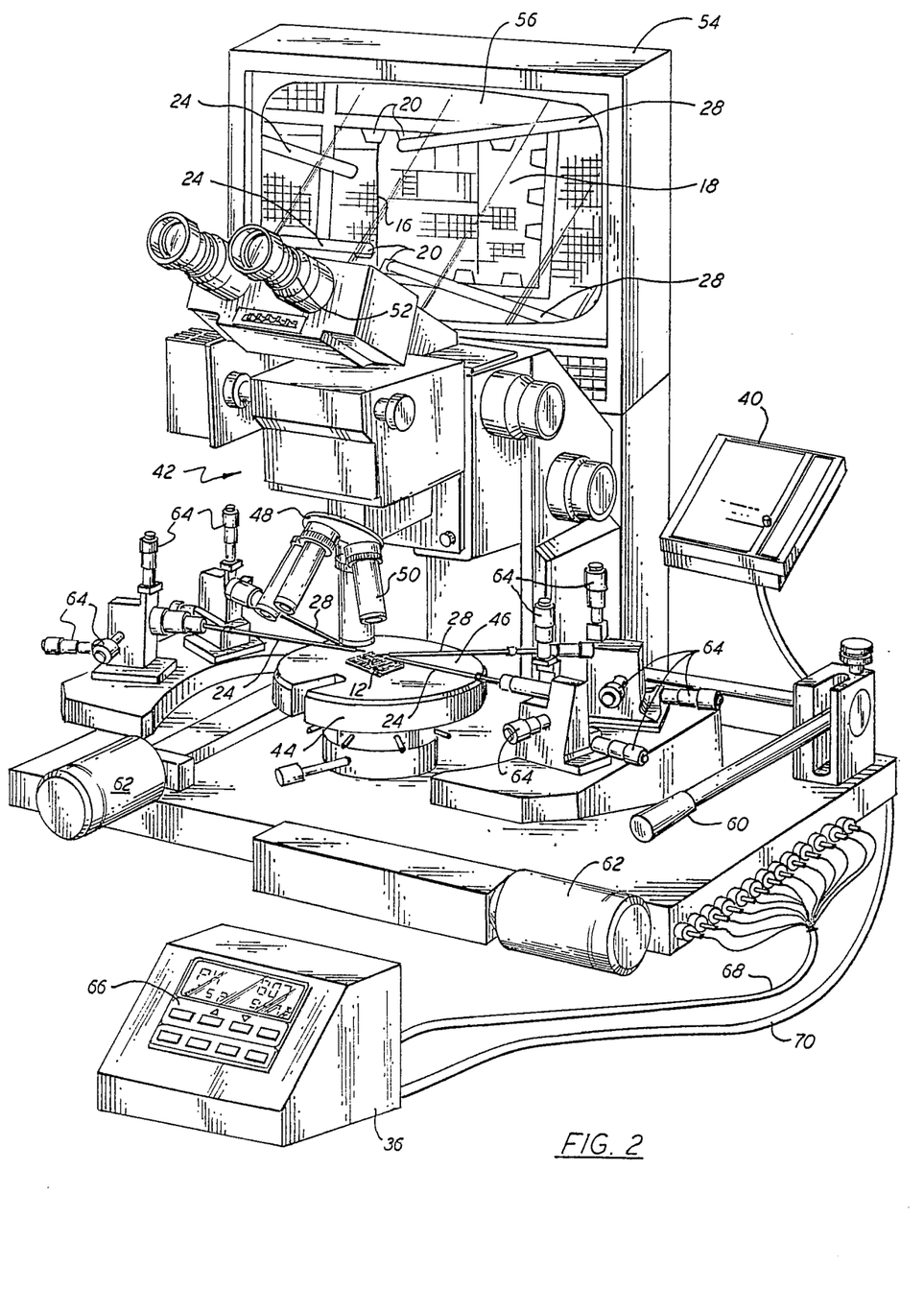
FIG. 2 is a perspective view of testing apparatus according to an embodiment of this invention.

Apparatus for testing the thin-film conductors of a plurality of densely packed integrated circuit devices, which are all formed in various respective areas on a semiconductor wafer, is shown schematically in FIG. 1, and in perspective form in FIG. 2.

As shown in FIG. 1, a test specimen 10 is situated on a semiconductor wafer 12, which forms a substrate 14 for an aluminum or aluminum alloys thin-film conductor 16 situated within the integrated circuit 18. The conductor 16 terminates at respective electrode paths 20.

A constant-current source 22 supplies a uniform current $I_c$ to a pair of probes 24 which are contacted with respective ones of the electrode paths 20. This uniform current $I_c$ flows across the thin stripe conductor 16.

A voltage measuring circuit 26 measures the voltage drop $V_s$ across the conductor 16, and has a pair of probes 28 respectively coupled to opposite ones of the electrode pads 20.

A resistive heating element 30 is situated on a support for the wafer 12, and in thermal communication with the conductor 16, while a sensor 32, also in thermal communication with the conductor 16, measures the temperature of the wafer 12 and provides an output signal that varies with the temperature. A heater current circuit 34 provides, as a linearly increasing ramp current, a heater current $I_H$ that flows through the resistive heating element 30. The signal from the sensor 32 is applied to an input of a temperature control circuit 36 which, in turn, controls the heater current circuit 34.

A signal representing the voltage drop $V_s$ over the stripe and a signal representing the stripe temperature T are supplied to a data processing circuit 38 from the voltage measuring device and from the temperature control circuit 36, respectively. The data processing device records or stores values corresonding to the temperature T and the resistance $R = V_s/I_c$, and these values are employed in calculating the relationships that are plotted on an X-Y plotter 40 to obtain the above-mentioned slope s and intercept I. From these the activation energy Q and pre-exponential factor A can be derived.

The apparatus for carrying out this test is set up generally as shown in FIG. 2, and employs a failure analysis test station 42 of the type shown. In the preferred mode, the test apparatus 42 is a failure analysis test station model REL-4100A, manufactured by Alessi, Inc., of Irvine, Calif. However, other similar test apparatus could be similarly employed. At the test station a platen 44, which is movable in the horizontal plane and in the vertical plane, holds a chuck 46 on which the wafer 12 is held in place by vacuum. The chuck 46 in this embodiment is a programmable hot chuck incorporating it in the resistive heater 30, as well as the current supply 34. This hot chuck 46 can be the model TP36 Thermal Chuck system as manufactured by Temptronics Corporation, of Newton, Mass. Also shown on the test station 42 are scope optics 48 having a turret 50 containing objective lenses of various powers, and oculars or eye pieces 52. Also shown behind the test station 42 is a video display monitor 54. In this embodiment, the test station 42 contains a video imager or camera (not shown) which supplies a video image of the integrated circuit 18 so that the latter is displayed as a video image 56 on the display monitor 54. Also shown are a lever 60 for adjusting the position of the platen 44, and a number of barrel lead screws 62 for adjusting the positions of the platen 44 and chuck 46. A number of further barrel driven lead screws are associated with the X, Y, and Z planes of movement of the four probes 24—24 and 28—28. Optionally, transport of the platen 44 and chuck 46, and positioning of the probes 24 and 28 can be motorized and carried out by remote control.

These probes 24—24 and 28—28, as well as the electrode paths 20 and the conductor 16 of the integrated circuit 18 are graphically depicted here on the video image 56 displayed on the monitor 54.

The temperature control circuit 36 is here provided as a programmable temperature controller, in this case a model no. CN-2010 manufactured by Omega Engineering, Inc., Stanford, Conn. This device has a control and display panel 66, which shows the display subroutine during a programming mode, as well as displaying the temperature and time remaining during a test. The panel 66 contains various manual entry keys for use in programming the temperature controller or in calling up desired displays, as well as for starting and stopping the testing routine. This type of programmable temperature controller 36 provides a programmed temperature ramp in which the particular integrated circuit 18 of the wafer 12 is heated at a precise, linearly increasing rate over a predetermined period of time, which period can extend from several minutes up to 100 hours.

Contained within the housing for the programmable temperature controller 36 is the data processing circuit 38 for computing the logarithmetic value as mentioned above to be plotted. A multi-conductor cable connects the test station 42 with the temperature controller 36, and another cable 70 connects the temperature controller 36 with the X-Y plotter 40.

The invention will now be explained in greater detail with reference to the following examples:

EXAMPLE 1

Employing the apparatus illustrated in FIGS. 1 and 2 a number of samples supplied by the National Bureau of Standards were tested. In these experiments a temperature programmer (model no: 2011 P2-253, manufactured by LFE Corporation) was used to ramp the temperatue.

The samples were pure Aluminum stripes deposited on silicon. The nominal values of stripe dimensions, (thickness=0.89 $\mu$, width=3 $\mu$) which were supplied by the manufacturer, were used to calculate the cross-sectional area of the stripe.

The measured value of temperature was corrected for Joule heating to determine the actual temperature of the stripe. For these calculations, the temperature coefficient of resistance was measured to be equal to 0.0004 OHM/K. Measurement of the stripe resistance at low and at test currents allowed the temperature correction, $(\Delta T)_{corr}$ to be calculated from the following equation:

$$(\Delta T)_{corr} = 1/\alpha[R_{test}/R_{low} - 1]$$

Where $R_{test}$ is the resistance measured using the test current (at t=0) and $R_{low}$ is the resistance measured using a low current. The actual temperature was obtained by adding $(\Delta T)_{corr}$ to the measured temperature. This method of temperature correction was used in the experimental procedures employed. The value of $(\Delta T)_{corr}$ obtained at 300K was used to correct the temperature during the entire experimental temperature range. Auxillary experiments demonstrated that this was a valid assumption.

The experiments were carried out on 800 $\mu$ and 1200 $\mu$ long stripes. The heating rate was fixed at 0.7K/min. Because of differences in coefficients of thermal expansion, between the wafer and the probes, at higher heating rates, the probes tended to scratch out the contact pad leading to an open circuit. Hence, as mentioned earlier, a temperature programmer was used instead of the TP-36 C-V PLOT Thermochuck system, as the latter could ramp the temperature only at 30K/min. The stripes were stressed at a current density of 2.5 MA/cm². All the stripes failed at temperatures lower than 300° C.

Figure 3:
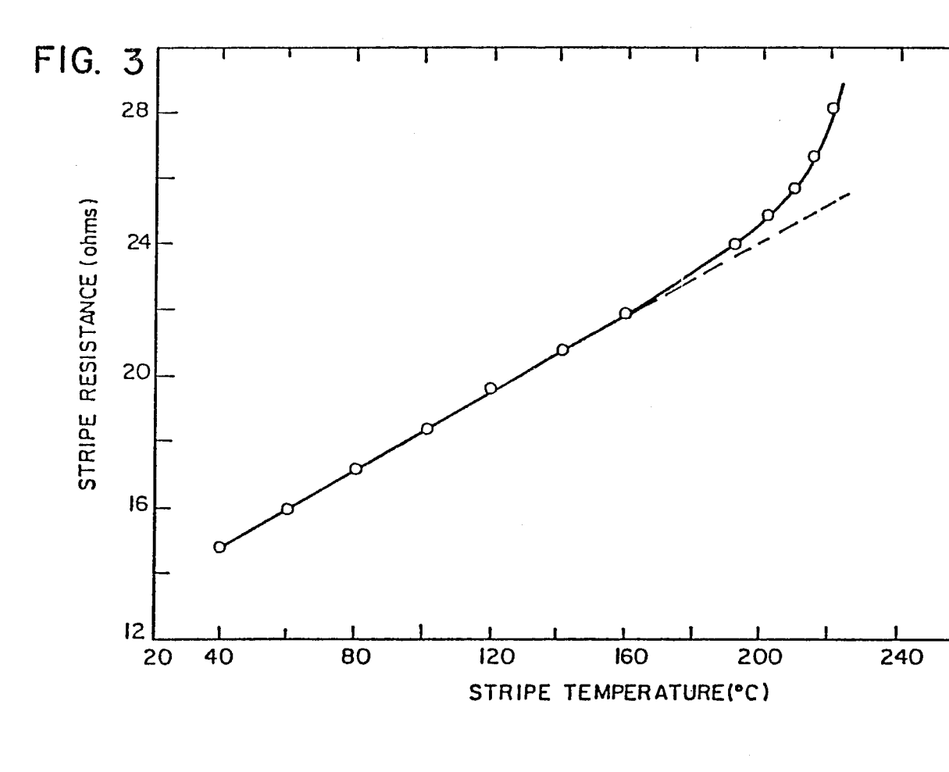
FIG. 3 is a graphic representation in which the resistance of a thin film stripe is plotted against temperature.
Figure 4:
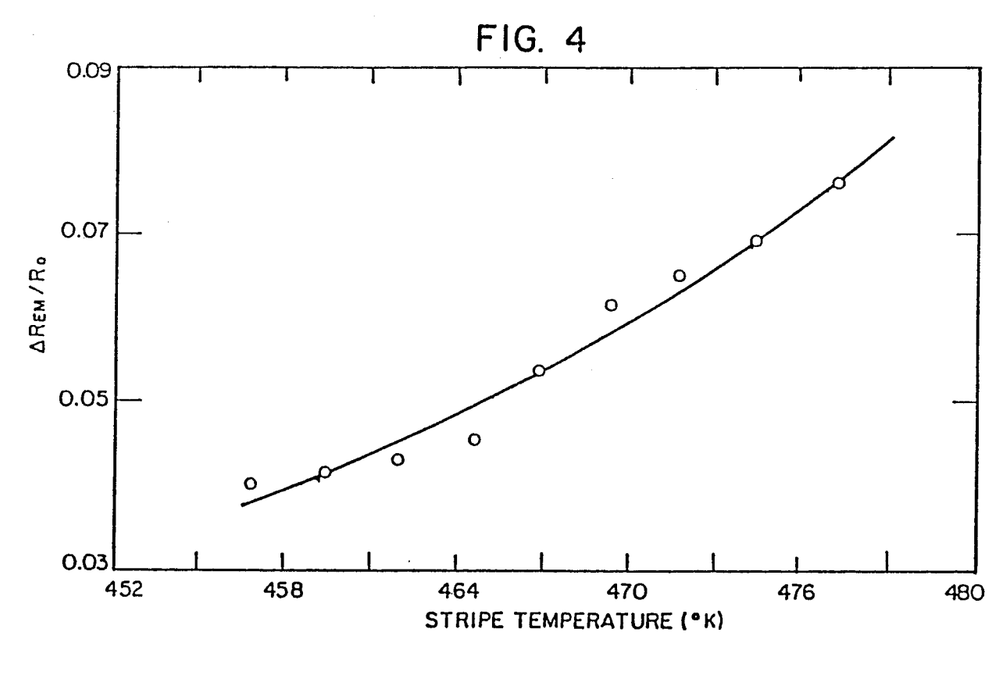
FIG. 4 illustrates the increase in resistance from electromigration as a function of stripe temperature.
Figure 5:
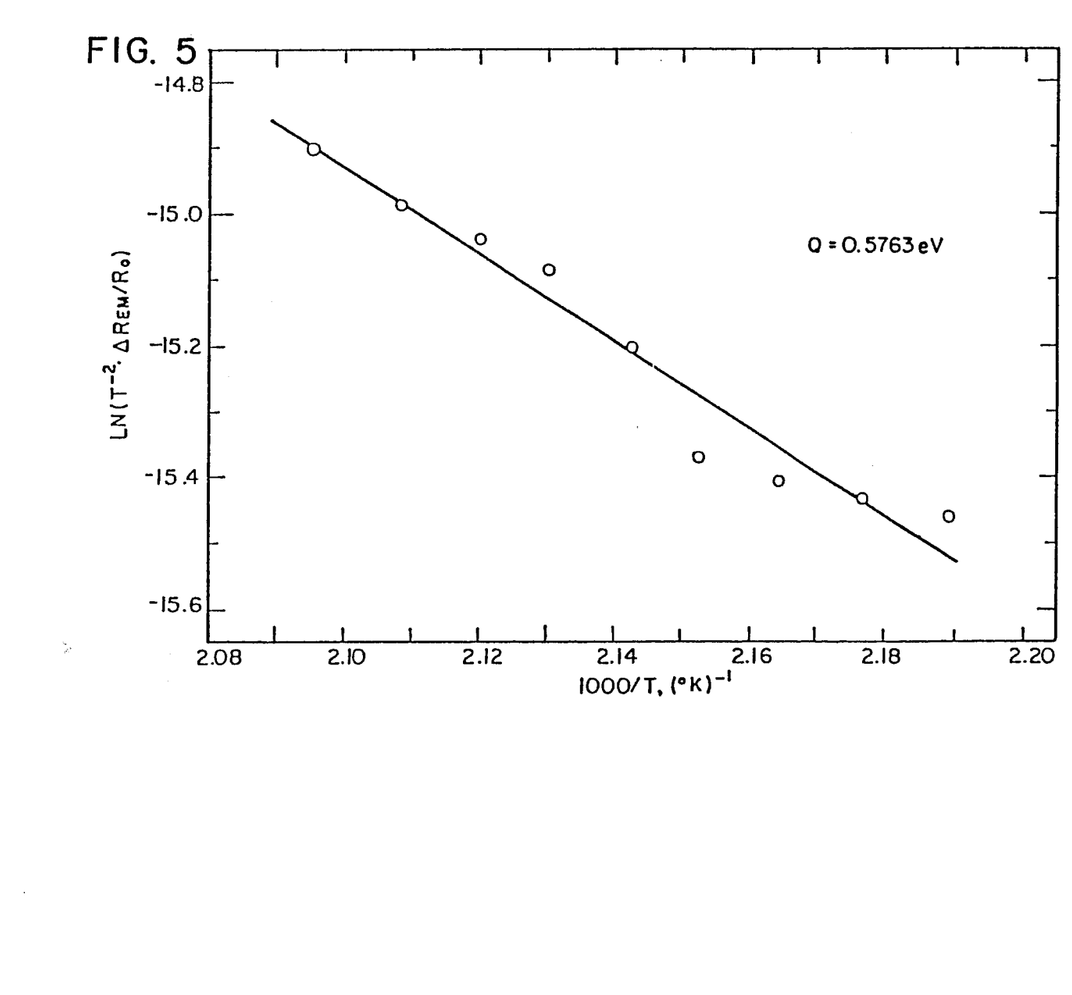
FIG. 5 illustrates the characteristic plot from which activation energy and pre-exponential is derived.

FIG. 3 shows the resistance versus temperature plot for a stripe stressed at 2.5 MA/cm. FIG. 4 shows the increase in resistance from electromigration as a function of stripe temperature for the above conditions. The heating rate was fixed at 0.7K/min. The solid line was drawn on the basis of the activation energy determined by analyzing the characteristic plot and numerical determination of the pre-exponent. FIG. 5 shows the characteristic plot from which the activation energy (Q=0.576 eV) was obtained.

EXAMPLE 2

Employing procedures identical to those described in Example 1, six individual conductors were tested in separate experiments. Table I summarizes the results of Q and A obtained from experiments at the wafer level.

TABLE I

| Example | Values of Q and A | |
|---|---|---|
| | Q eV | A sec$^{-1}$ |
| 1 | 0.576 | 22.06 |
| 2a | 0.439 | 0.94 |
| 2b | 0.541 | 11.44 |
| 2c | 0.522 | 23.83 |
| 2d | 0.598 | 38.90 |
| 2e | 0.781 | 3629. |
| 2f | 0.782 | 4400.4 |

Average Q = 0.575 eV.
Standard Deviation = 0.029 eV.

The National Bureau of Standards reported that a reliable value of Q is 0.6 eV. To one skilled in the art the values reported by the experimental technique are in accord with the suppliers' value of Q. The variations in Q are explained in detail in the reference "Compensation, Effects in Electromigration Kinetics" by J. A. Schwarz and L. E. Felton, Solid State Electronics Vol. 28 No 7, p 669–675 (1985).

It should be apparent from the foregoing that with the apparatus described hereinabove, the electromigration failure kinetic parameters can be quickly yet accurately measured for each of the many integrated circuits 18 found on a multiple IC wafer, and this test procedure can be carried out sequentially for each of the integrated circuits 18 thereon. Moreover, this electromigration failure testing is carried out without resort to a sealed chamber, although it would be desirable to do the testing in a clean room environment.

While the invention has been described in detail with respect to a single preferred embodiment, it should be understood that the invention is not limited to that precise embodiment, and that many modifications and variations would present themselves to those of skill in the art without departure from the scope and spirit of this invention, as defined in the appended claims.

I claim:

1. A method for determining the kinetic parameters of activation energy and pre-exponential factor which characterize electromigration failure in a thin-film conductor that is formed as a part of an integrated circuit on a semiconductor wafer which is subject to high current densities at elevated temperatures, said method comprising the steps of placing said semiconductor wafer on a test platform having a plurality of probes which can be moved into electrical contact with said thin-film conductor, said platform containing a resistive heating element which is in thermal communication to said semiconductor wafer whereby the wafer is heated;

electrically stressing the thin-film conductor by applying a uniform current thereto;

supplying a ramp current to said resistive heating element for heating the stressed conductor to increase the conductor temperature at a rate that is linear with respect to time, said rate being less than about 1.0 degrees K. per minute, so as to avoid scratching of the thin-film conductor by the probes;

measuring changes in resistance of the current-stressed conductor as it is being heating at a linear rate; and calculating said activation energy and said pre-exponential factor by relating the measured changes in resistance over time produced by the electromigration process.

2. The method of claim 1 wherein the activation energy and the pre-exponential factor are calculated using a zeroth order rate expression wherein $$1/R_o dR/dt = A \exp(-Q/kT)$$

Where: $R_o$ is the initial resistance of the thin-film conductor dR/dt is the variation in the conductor resistance produced by the electromigration process, Q is the activation energy for the process, A is the pre-exponential for the electromigration process, k is the Boltzmann's constant, and T is absolute temperature.

3. The method of claim 1 including the step of compensating the measured changes in resistance for changes in resistance due to temperature dependent components to determine the changes produced as a result of the electromigration process.

4. The method of claim 1 wherein said semiconductor wafer contains a plurality of like integrated circuits, and each of the latter contains a plurality of thin-film conductors, said method being carried out sequentially on a number of said thin-film conductors while said wafer remains in place on said test platform.

5. The method of claim 1, wherein said ramp current is supplied to said resistive heating element from a temperature controller device.

6. The method of claim 1 including the further step of determining the activation energy for the electromigration process by plotting $$\ln[T^{-2}(\Delta R_{em}/R_o)] \text{ vs } 1/T,$$

where: $\Delta R_{em}$ is the change in resistance of the conductor produced by the electromigration process.

7. The method of claim 6 wherein the activation energy of the process is determined from the plot according to the relationship $$Q = -ks,$$

where s is the slope of the plotted line.

8. The method of claim 6 that further comprises the step of determining the pre-exponential factor from the relationship $$I = \ln(Ak/\beta Q) \text{ so } A = -S \exp I$$

where $\beta$ is the heating rate.

9. Apparatus for testing a thin-film conductor that is contained in an integrated circuit on a semiconductor wafer, to determine the kinetic parameters of activation energy and pre-exponential factor leading to electromigration failure in the conductor, including a semiconductor wafer unit including a test platform on which said wafer is mounted, a plurality of probes which can be moved to contact with a thin-film conductor on said semiconductor wafer, and a resistive heating element mounted on said platform which is in thermal communication with said semiconductor wafer;

electrical means coupled to one pair of said probes for supplying a constant current flow through said conductor as the same is being heated;

heating current supply means supplying a ramp current to said resistive heating element for increasing the temperature of said wafer and the temperature of said conductor at a rate that is linear over time, including means for maintaining the linear rate of temperature increase at or below 1 degree K. per minute;

first means coupled to another pair of said probes to measure the changes in resistance to said conductor as the temperature thereof increase at said linear rate over a predetermined period of time; and second means to measure the change in temperature of said wafer so that the change in conductor resistance due to the electromigration failure process can be calculated by relating such changes to said activation energy and pre-exponential factor, wherein a record of the changes in resistance over said predetermined period of time is obtained.

10. The apparatus of claim 9 further comprising recording means for recording a record of changes in resistance and changes in temperature over said predetermined period of time.

11. The apparatus of claim 10 further comprising a plotter coupled to said recording means for producing a plot of the changes in resistance versus the changes in temperature.

12. The apparatus of claim 9, wherein said heating current supply means includes a programmable temperature controller for automatically increasing the current to said heating element to produce the desired increases in temperature for said wafer.

13. The apparatus of claim 9, wherein said test station device includes means for adjusting the positions of said probes while said semiconductor wafer remains positioned on said test platform so that similar thin-film conductors on a number of integrated circuits on said wafer can be tested sequentially to determine the kinetic parameters of activation energy and pre-exponential factor for each such conductor.

14. The method of claim 1 wherein said rate of increase of conductor temperature is on the order of 0.7 degrees per minute.

* * * * *